US006977521B2

(12) United States Patent
Wang (10) Patent No.: US 6,977,521 B2
(45) Date of Patent: Dec. 20, 2005

(54) FIELD PROGRAMMABLE GATE ARRAY

(75) Inventor: Man Wang, Sunnyvale, CA (US)

(73) Assignee: KLP International, Ltd., Santa Clara, CA (US)

( * ) Notice: Subject to any disclaimer, the term of this patent is extended or adjusted under 35 U.S.C. 154(b) by 0 days.

(21) Appl. No.: 11/109,966

(22) Filed: Apr. 19, 2005

(65) Prior Publication Data

US 2005/0184754 A1 Aug. 25, 2005

Related U.S. Application Data (62) Division of application No. 10/642,370, filed on Aug. 15, 2003, now Pat. No. 6,924,664.

(51) Int. Cl.[7] .......................................... H03K 19/177
(52) U.S. Cl. ......................................... 326/41; 326/38
(58) Field of Search ............................... 326/41, 38, 47

(56) References Cited

U.S. PATENT DOCUMENTS

| | | |
|---|---|---|
| 3,634,929 A | 1/1972 | Yoshida et al. |
| 4,322,822 A | 3/1982 | Mc Pherson |
| 4,488,262 A | 12/1984 | Basire |
| 4,490,900 A | 1/1985 | Chiu |
| 4,502,208 A | 3/1985 | Mc Pherson |
| 4,507,757 A | 3/1985 | Mc Elroy |
| 4,543,594 A | 9/1985 | Mohsen |
| 4,546,273 A | 10/1985 | Osman |
| 4,599,705 A | 7/1986 | Holmberg |
| 4,613,886 A | 9/1986 | Chwang |
| 4,670,749 A * | 6/1987 | Freeman ............... 326/38 |
| 4,677,742 A | 7/1987 | Johnson |
| 4,758,745 A | 7/1988 | El Gamal et al. |
| 4,758,986 A | 7/1988 | Kuo |
| 4,794,562 A | 12/1988 | Kato |
| 4,823,181 A | 4/1989 | Mohsen |
| 4,870,302 A | 9/1989 | Freeman |
| 4,876,220 A | 10/1989 | Mohsen |
| 4,899,205 A | 2/1990 | Hamdy |
| 4,943,538 A | 7/1990 | Mohsen |
| 4,962,342 A | 10/1990 | Mead |
| 5,138,410 A | 8/1992 | Takebuchi |
| 5,150,179 A | 9/1992 | Gill |
| 5,303,185 A | 4/1994 | Hazani |
| 5,304,871 A | 4/1994 | Dharmarajan |
| 5,323,342 A | 6/1994 | Wada |
| 5,412,244 A | 5/1995 | Hamdy |
| 5,455,525 A | 10/1995 | Ho et al. |
| 5,477,499 A | 12/1995 | Van Buskirk |
| 5,496,756 A | 3/1996 | Sharma |
| 5,576,568 A | 11/1996 | Kowshik |
| 5,578,848 A | 11/1996 | Kwong et al. |
| 5,586,270 A | 12/1996 | Rotier |

(Continued)

FOREIGN PATENT DOCUMENTS

EP      0 295 935      12/1988

(Continued)

OTHER PUBLICATIONS

U.S. Appl. No. 09/629,570, Bourassa et al.

(Continued)

*Primary Examiner*—Daniel D. Chang
(74) *Attorney, Agent, or Firm*—Perkins Coie LLP (57) ABSTRACT

A field programmable gate array (FPGA) having hierarchical interconnect structure is disclosed. The FPGA includes logic heads that have signals routed therebetween by the interconnect structure. Each logic head includes a plurality of cascadable logic blocks that can perform combinatorial logic. The logic head can further be fractured into two independent logical units.

5 Claims, 10 Drawing Sheets

U.S. PATENT DOCUMENTS

| | | | |
|---|---|---|---|
| 5,587,603 A | 12/1996 | Kowshik | |
| 5,600,264 A * | 2/1997 | Duong et al. | 326/39 |
| 5,600,265 A | 2/1997 | El Gamal | |
| 5,650,336 A | 7/1997 | Eriguchi et al. | |
| 5,675,541 A | 10/1997 | Leterrier | |
| 5,675,547 A | 10/1997 | Koga | |
| 5,745,417 A | 4/1998 | Kobayashi et al. | |
| 5,781,032 A | 7/1998 | Bertolet et al. | |
| 5,784,636 A | 7/1998 | Rupp | |
| 5,825,200 A | 10/1998 | Kolze | |
| 5,825,201 A | 10/1998 | Kolze | |
| 5,880,512 A | 3/1999 | Gordon | |
| 5,889,411 A | 3/1999 | Chaudhary | |
| 5,892,962 A | 4/1999 | Cloutier | |
| 5,909,049 A | 6/1999 | McCollum | |
| 5,929,482 A | 7/1999 | Kawakami | |
| 5,986,931 A | 11/1999 | Caywood | |
| 5,986,939 A | 11/1999 | Yamada | |
| 6,016,268 A | 1/2000 | Worley | |
| 6,031,761 A | 2/2000 | Ghilardelli et al. | |
| 6,034,893 A | 3/2000 | Mehta | |
| 6,040,968 A | 3/2000 | Duvvury | |
| 6,047,243 A | 4/2000 | Bang | |
| 6,064,225 A | 5/2000 | Andrews et al. | |
| 6,064,595 A | 5/2000 | Logie et al. | |
| 6,077,719 A | 6/2000 | Koike | |
| 6,084,428 A | 7/2000 | Kolze | |
| 6,097,077 A | 8/2000 | Gordon | |
| 6,153,463 A | 11/2000 | Wei et al. | |
| 6,157,568 A | 12/2000 | Schmidt | |
| 6,166,954 A | 12/2000 | Chern | |
| 6,198,652 B1 | 3/2001 | Kawakubo | |
| 6,214,666 B1 | 4/2001 | Mehta | |
| 6,215,140 B1 | 4/2001 | Reisinger et al. | |
| 6,218,274 B1 | 4/2001 | Komatsu | |
| 6,232,631 B1 | 5/2001 | Schmidt et al. | |
| 6,236,229 B1 | 5/2001 | Or-Bach | |
| 6,249,809 B1 | 6/2001 | Bro | |
| 6,282,123 B1 | 8/2001 | Mehta | |
| 6,294,809 B1 | 9/2001 | Logie | |
| 6,297,103 B1 | 10/2001 | Ahn et al. | |
| 6,304,666 B1 | 10/2001 | Warren | |
| 6,337,250 B2 | 1/2002 | Furuhata | |
| 6,351,428 B2 | 2/2002 | Forbes | |
| 6,421,293 B1 | 7/2002 | Candelier et al. | |
| 6,431,456 B2 | 8/2002 | Nishizawa, et al. | |
| 6,445,619 B1 | 9/2002 | Mihnea et al. | |
| 6,456,535 B2 | 9/2002 | Forbes, et al. | |
| 6,459,634 B1 | 10/2002 | Sher | |
| 6,476,636 B1 | 11/2002 | Lien et al. | |
| 6,515,509 B1 | 2/2003 | Baxter | |
| 6,556,481 B1 | 4/2003 | Hsu | |
| 6,602,729 B2 | 8/2003 | Lin | |
| 6,633,182 B2 | 10/2003 | Pileggi et al. | |
| 6,650,143 B1 | 11/2003 | Peng | |
| 6,674,670 B2 | 1/2004 | Jeung | |
| 6,678,646 B1 | 1/2004 | McConnell et al. | |
| 6,700,151 B2 | 3/2004 | Peng | |
| 6,753,590 B2 | 6/2004 | Fifield et al. | |
| 6,754,881 B2 | 6/2004 | Kuhlmann et al. | |
| 6,777,757 B2 | 8/2004 | Peng et al. | |
| 6,862,205 B2 | 3/2005 | Agata et al. | |
| 2001/0003374 A1 | 6/2001 | Bohmer | |
| 2003/0218920 A1 | 11/2003 | Harari | |

FOREIGN PATENT DOCUMENTS

JP 61292295 12/1986

OTHER PUBLICATIONS

Wu, E.W. et al; Voltage-Dependent Voltage-Acceleration of Oxide Breakdown for Ultra-Thin Oxides; IEEE, 2000, pp. 1-4.

Sune, Jordi et al; Post Soft Breakdown Conduction in SiO2 Gate Oxides; IEEE, 2000, pp. 1-4.

DeGraaf, C., et al, A Novel High-Density Low Cost Diode Programmable Read Only Memory, IEEE, 1996, pp. 7.6.1-7.6.4.

Rasras, Mahmoud et al; Substrate Hole Current Origin After Oxide Breakdown; IEEE, 2000, pp. 1-4.

Lombardo, S. et al; Softening of Breakdown in Ultra-Thin Gate Oxide nMOSFET's at Low Inversion Layer Density; 39th Annual International Reliability Physics Symposium; Orlando, FL 2001, pp. 163-169.

Miranda, Enrique et al; Analytic Modeling of Leakage Current Through Multiple Breakdown Paths in SiO2 Films; 39th Annual International Reliability Physics Symposium; Orlando, FL 2001, pp. 369-379.

* cited by examiner

| SWITCH | S1 | S2 | S3 | S4 | S5 | S6 | S7 | EQUATION |
|---|---|---|---|---|---|---|---|---|
| AND2 | ✓ | ✗ | ✗ | ✗ | ✓ | ✗ | ✓ | OP = IP1 & IP2 |
| NAND2 | ✗ | ✓ | ✗ | ✓ | ✗ | ✗ | ✓ | OP = !(IP1 & IP2) |
| OR2 | ✗ | ✓ | ✗ | ✗ | ✓ | ✓ | ✗ | OP = IP1 \| IP2 |
| NOR2 | ✓ | ✗ | ✗ | ✓ | ✗ | ✓ | ✗ | OP = !(IP1 \| IP2) |
| XOR2 | ✗ | ✗ | ✓ | ✓ | ✗ | ✗ | ✓ | OP = (IP1 & !IP2) \| (!IP1 & IP2) |
| XNOR2 | ✗ | ✗ | ✓ | ✓ | ✗ | ✓ | ✗ | OP = (IP1 & IP2) \| (!IP1 & !IP2) |

NOTE: ✓ : SWITCH ON   ✗ : SWITCH OFF

FIGURE 9

: CONVENTIONAL 3-DIRECTION ROUTING

FIGURE 10

FIELD PROGRAMMABLE GATE ARRAY

CROSS-REFERENCE TO RELATED APPLICATION

This application is a divisional of U.S. patent application Ser. No. 10/642,370 filed Aug. 15, 2003, now U.S. Pat. No. 6,924,664, which is hereby incorporated by reference in its entirety.

TECHNICAL FIELD

The present invention relates to field programmable gate arrays (FPGA), and more particularly, to a FPGA that has logic heads with configurable logic blocks in a cascading structure.

BACKGROUND

Field programmable gate arrays (FPGA) are commonly used in many applications that require complex logic functions. In general, FPGAs are comprised of logic heads (also referred to as cells) arranged in a repeating manner and interconnect structures that route signals between the various cells. There are many different types of FPGA architectures that are commercially available from vendors such as Xilinx, Altera, Actel, Lattice Semiconductor, QuickLogic, and others.

In any FPGA architecture, there are design tradeoffs between some basic considerations. For example, the complexity of the cell and the placement and routing of the interconnect structures between the cells are important. A highly complex logic cell, for example, a look-up table based coarse grain, may be able to perform a large number of sophisticated operations. However, if a relatively simple operation, such as that of a NAND gate is required by the FPGA user, much of the functionality and occupied space of the logic cell is wasted.

On the other hand, a logic cell that consists of simple multiplexers and basic logic gates would require the use of a relatively high amount of valuable wiring resources (and silicon real estate) to achieve complex functionality. Thus, in any FPGA architecture, balance must be reached between functionality and flexibility. Furthermore, the ease of use of the routing of the interconnect resources, operating speed, and power dissipation of the configured FPGA are other considerations.

DETAILED DESCRIPTION

In the detailed description provided below, three different embodiments of a memory cell are disclosed. The programming methods and circuits disclosed herein are applicable to all three. Further, numerous specific details are provided to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
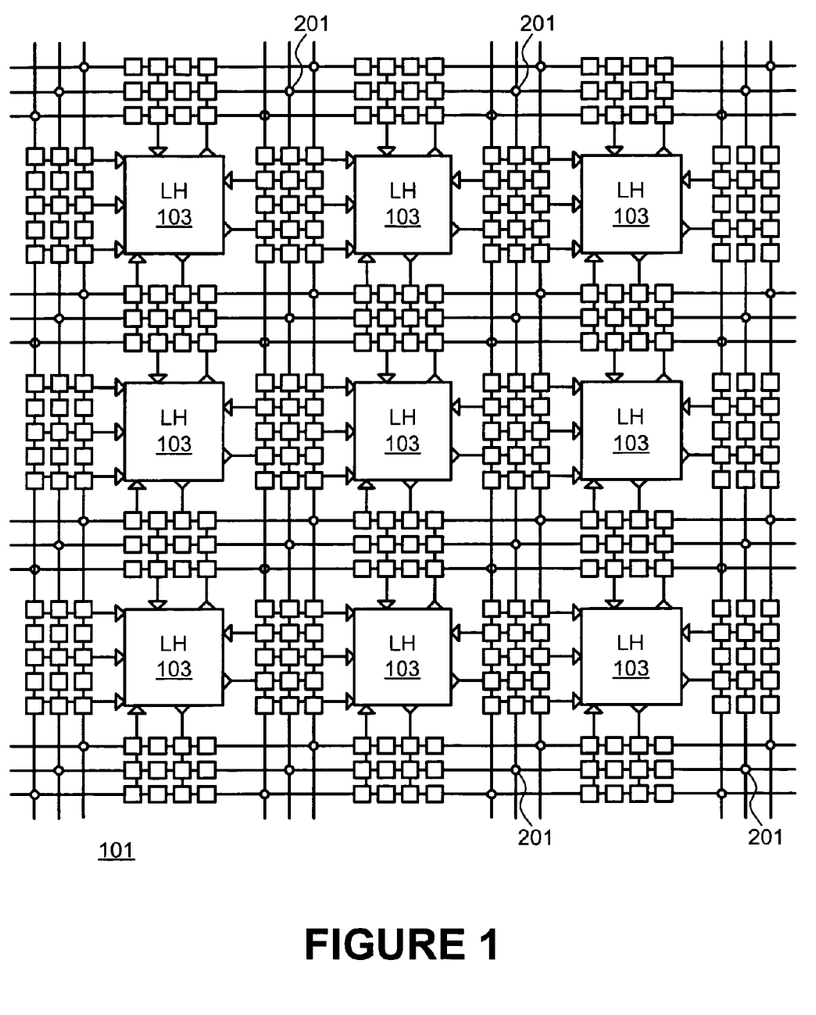
FIG. 1 is a schematic illustration of an FPGA architecture showing a level one interconnect structure formed in accordance with the present invention.

FIG. 1 shows in schematic form an FPGA formed in accordance with the present invention. The FPGA 101 comprises a plurality of logic heads 103 arranged in a two-dimensional array. Providing inputs to logic heads 103 and routing outputs between logic heads 103 is a level one interconnect 105. In the present invention, the level one interconnect 105 is just one level of a three-level hierarchical interconnect structure that will be described in more detail below. In generally, however, the hierarchical interconnect structure comprises a series of hierarchical routing lines that can be configured using programmable switches. Each switch may be formed, for example, by an NMOS pass transistor and a nonvolatile memory cell.

Figure 3:
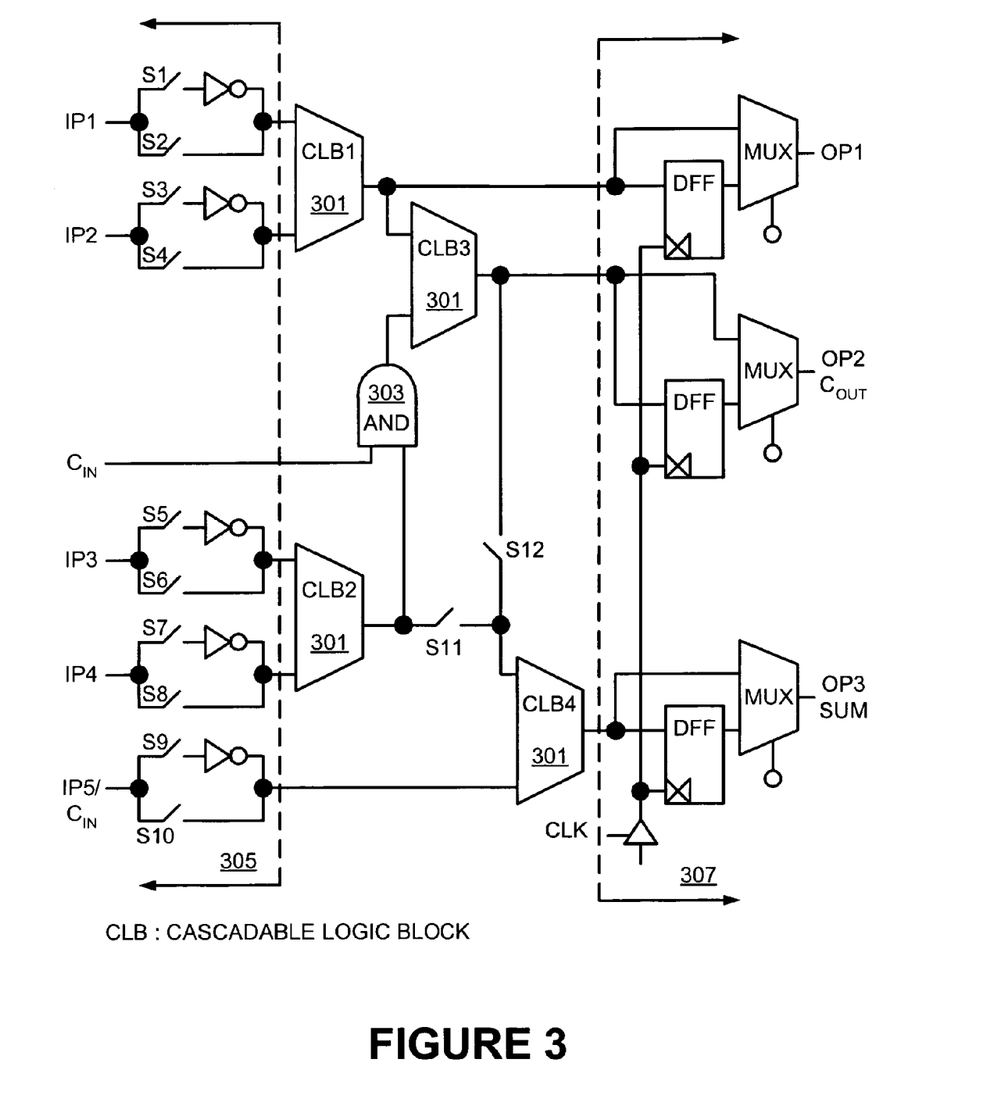
FIG. 3 is a detailed schematic of a logic head cell used in the FPGA architecture of the present invention.

The logic heads 103 are designed to perform logic functions according to the setting of programmable switches within the logic head 103. As shown in FIG. 3, a logic head 103 consists of four configurable two input, one output logic blocks 301, twelve switches S1–S12, a two-input AND gate 303, five inverters, three double-edged D-type flip-flops, and three two-input multiplexers. Note that the logic head 103 has six inputs, four for regular data input, one dedicated carry-in input, and one shared between regular data input and carry-in.

The logic head 103 has three outputs selectable between registered and nonregistered. The logic head 103 has an input section 305 and an output section 307. The input section 305 receives the six inputs designated IP1–IP5/$C_{in}$ and $C_{in}$. The input signals IP1–IP5/$C_{in}$ are routed through switches S1–S10 and can provide, through the use of inverters, either the inputs IP1–IP5/$C_{in}$ or an inverted version thereof. The input section 305 is conventional with the prior art, except that the number of inputs may vary with the different FPGA architectures. In addition, the carry-in signal $C_{in}$ is also conventional with the prior art and is often used for arithmetic functions.

The output section 305 is also conventional with the prior art architectures that use a flip-flop and a registered or nonregistered output scheme. This is also referred to as a sequential or combinational output. Because the input section 305 and the output section 307 of the logic head 103 are substantially similar to those used in the prior art, discussion of those sections has been brief in order to not obscure aspects of the present invention.

Instead, the logic head 103 is novel due to the arrangement and use of the logic blocks 301 in a cascaded fashion. As seen in FIG. 3, the logic head 103 includes the first logic block CLB1 having as its inputs IP1 and IP2. As noted above, the inputs may be inverted by the use of the inverters in the input section 305. The operation of the logic blocks 301, as will be seen in greater detail below, is to provide comprehensive combinatorial logic generation based upon two inputs. In this case, logic block CLB1 is configurable to receive the inputs IP1 and IP2 and provide a combinatorial logic output based upon those inputs. A similar situation exists with respect to logic block CLB2 which receives as its input IP3 and IP4.

The output of logic block CLB1 is then provided as an output signal OP1 through the output section 307. Additionally, the output from logic block CLB1 is also provided as an input to logic block CLB3. The output of logic block CLB2 is provided to the AND gate 303. The second input to the AND gate 303 is the carry-in signal $C_{in}$. The output of the AND gate 303 is then provided as the second input to the logic block CLB3. The output of the logic block CLB3 can then be provided as output OP2 through the output section 307.

Note that switches S11 and S12 may also be programmed to route the signal output by logic block CLB2 as one input to logic block CLB4. This can be accomplished by closing the switch S11 while leaving open the switch S12. Alternatively, the switch S11 can be left open and the switch S12 can be closed resulting in the output of logic block CLB3 to be provided as an input to logic block CLB4. The output of logic block CLB4 is then provided as output OP3 through the output section 307. The second input to logic block CLB4 is provided by input IP5/$C_{in}$ through the input section 305.

Note that the four logic blocks CLB1–CLB4 are cascaded. In other words, the output of logic blocks CLB1 and CLB2 can be selectively routed to logic block CLB3 and/or logic block CLB4. This allows for significantly complex logic functions to be implemented, yet still maintaining a relatively small logic head size.

Further, while in one specific embodiment four logic blocks are shown, additional or fewer logic blocks may be cascaded or chained together to accommodate larger numbers of inputs.

Another important aspect of the logic head 103 is that the logic head can be functionally fractured into two separate combinatorial logic paths. For example, logic blocks CLB1 and CLB3 can form a first two-input combinatorial logic circuit and logic blocks CLB2 and CLB4 can form a three-input (IP3–IP5/$C_{in}$) combinatorial logic circuit. When the logic head 103 is configured correctly, both of these two logic paths can operate independently and provide independent outputs. Thus, in an important sense, the logic block 103 of the present invention has great flexibility insofar as it is able to function as separate logic circuits, yet combine itself into more complex combinatorial circuitry.

Furthermore, another aspect of the logic head 103 is the existence of a carry-chain from Cin to Cout. The carry-chain passes through the AND gate 303 and can be routed to the logic block CLB3. This combination plays an essential role when a logic head is configured as a full-adder.

The logic block 103 can be configured to implement hundreds of logic functions, such as a 1-bit full adder, 5-bit all-one or all-zero detector, 4-bit equality or inequality comparator, even-bit or odd-bit parity generator, 1–2 demultiplexer, and many other functions.

Figure 4:
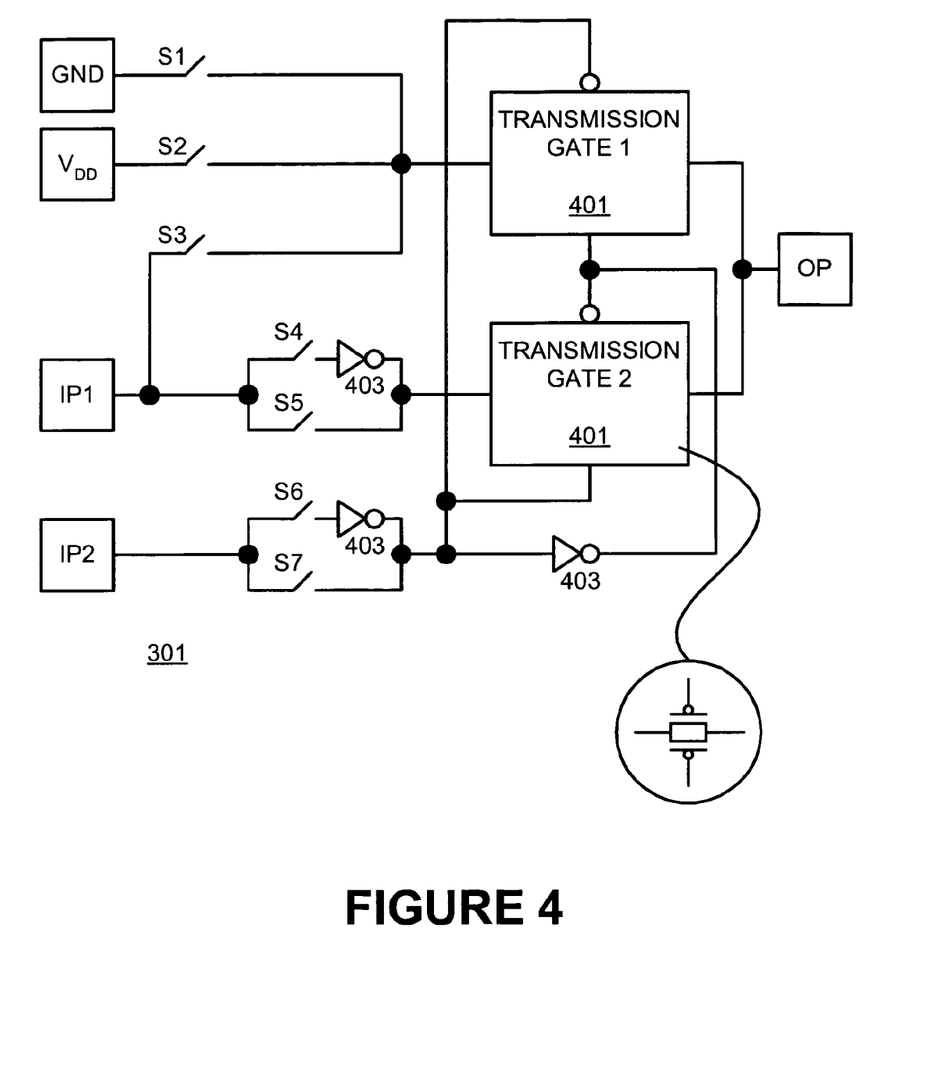
FIG. 4 is a schematic illustration of a logic block used within the logic head cells of FIG. 3.

The logic blocks 301 are shown in greater detail in FIG. 4. The logic blocks 301 consist of two transmission gates 401, seven switches S1–S7, and three inverters 403. By the use of the switches S1–S7, the logic block 301 can be configured as any two-input combinatorial logic gate, for example, an AND2, OR2, NOR2, XNOR2, XOR2, or NAND2, as well as an inverter or a passgate. Regular data inputs coming from IP1 and IP2 are routed through switches S3–S7 in a selective manner. Note that the transmission gates 401 can be formed, in one embodiment, as opposing complimentary MOSFETs (seen in the detail of FIG. 4). The transmission gates 401 will allow a signal to pass through when both its PMOS and NMOS are turned on, i.e., when a low signal is present on the gate of the PMOS and a high signal is present on the gate of the NMOS.

Further, the input of transmission gate one is provided (1) from ground (or low logic signal) if switch S1 is closed (programmed), (2) from $V_{dd}$ (or high logic signal) if switch S2 is closed (programmed), or (3) from IP1 if switch S3 is closed (programmed).

The input of transmission gate two is provided as either IP1 or an inverted version of IP2, depending upon which of switch S4 or S5 is programmed to be closed. Finally, the input IP2 is used to control which of the transmission gates 401 will allow a signal to pass through. Again, the input IP2 can be inverted using an inverter 403 depending upon the programming of switches S6 and S7.

Figure 9:
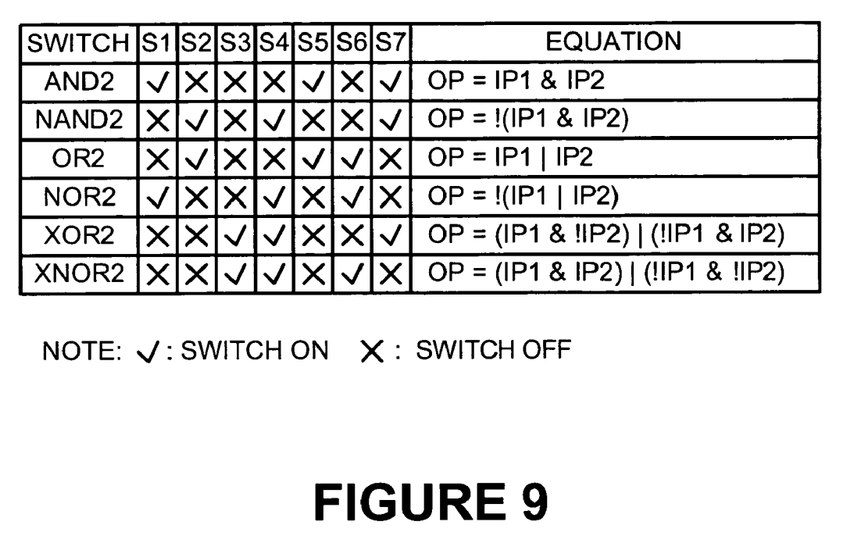
FIG. 9 shows a switch table illustrating how a logic block of FIG. 4 can be configured to perform various logical functions.

The configuration of the logic block 301 is completely controlled by whether or not the switches S1–S7 are closed or open. This is one programming aspect of the FPGA. For example, FIG. 9 shows a configuration switch table for implementing various logical functions by programming switches S1–S7.

Figure 5:
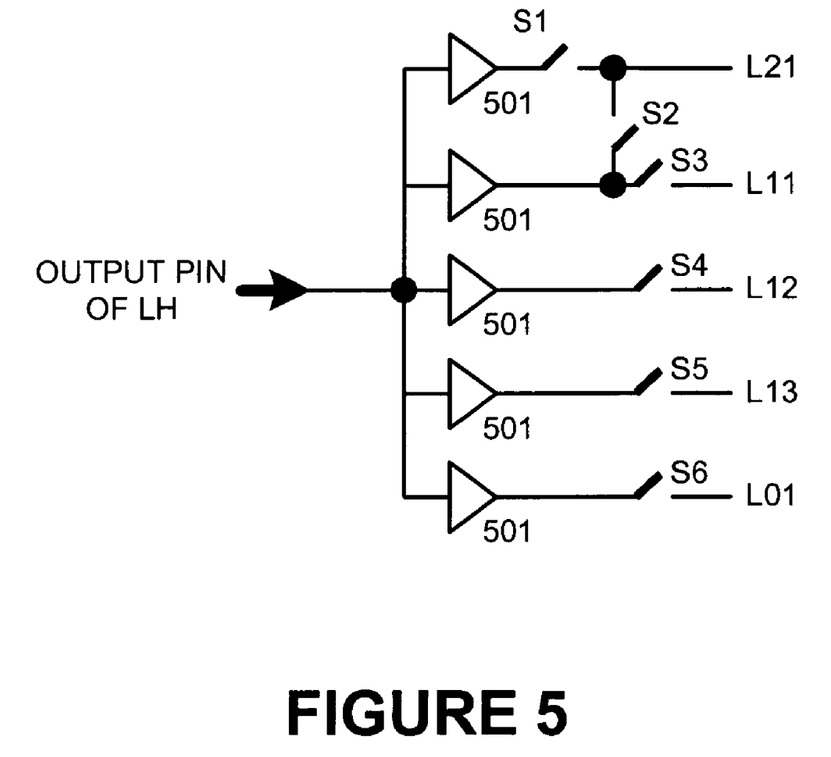
FIG. 5 shows a logic head output structure used by the logic head cells of FIG. 3.

Turning to FIG. 5, the outputs of a logic head 103 is routed to the interconnect structure by means of pass switches S1–S6 and buffers 501. For simplicity, FIG. 5 shows only one of the three outputs (OP1–OP3) of the logic head 103. The pass switches S1–S6 and buffers 501 are used to control which line or lines a particular output of a logic head should be driven on. For example, in FIG. 5, an output signal is presented to five buffers 501, in this particular embodiment, which can drive the output signal onto one of five output lines that form a portion of the interconnect structure 105. As will be seen in greater detail below, the output lines are designated as a "L" followed by two numbers. The first number indicates the "level of interconnect" and the second number indicates the line number for that level of interconnect. Thus, line L21 is line number one of the level two interconnect. In this example, only one line for the level two interconnect is shown, three lines of the level one interconnect is shown, and one line of the level zero interconnect is shown. It can be appreciated that each level of interconnect may have greater or fewer lines.

Precisely which lines the output is driven on is controlled by switches S1–S6. More than one switch may be on at the same time in the case where the output of the logic head is required to be driven on multiple output lines.

For example, when line L21 is driven, one or both switches S1 and S2 are switched on. If only one of the switches S1 and S2 is on, then only one buffer drives the output onto the line L21. However, if both switches S1 and S2 are turned on (i.e. closed), then two drivers drive the output signal onto line L21. This doubles the driving capability, which may be important if line L21 is a long line. Thus, in this situation, if we assume that line L21 is a "long line" wherein the output signal is to be driven to a receiver that is relatively distant from the output signal, then the output signal is driven by two output buffers so that the driving signal would be increased to compensate for the long distance of line L21. Thus, FIG. 5 shows an output circuit that can selectively increase the amount of driving capability by an arbitrary amount, depending upon how the configurable switches S1–S6 can route various buffers to a single line.

The concept of FIG. 5 can be expanded such that three or more buffers 501 drive a signal onto a single line. In this manner, flexibility is further gained by using the logic head output circuitry of FIG. 5.

Figure 7:
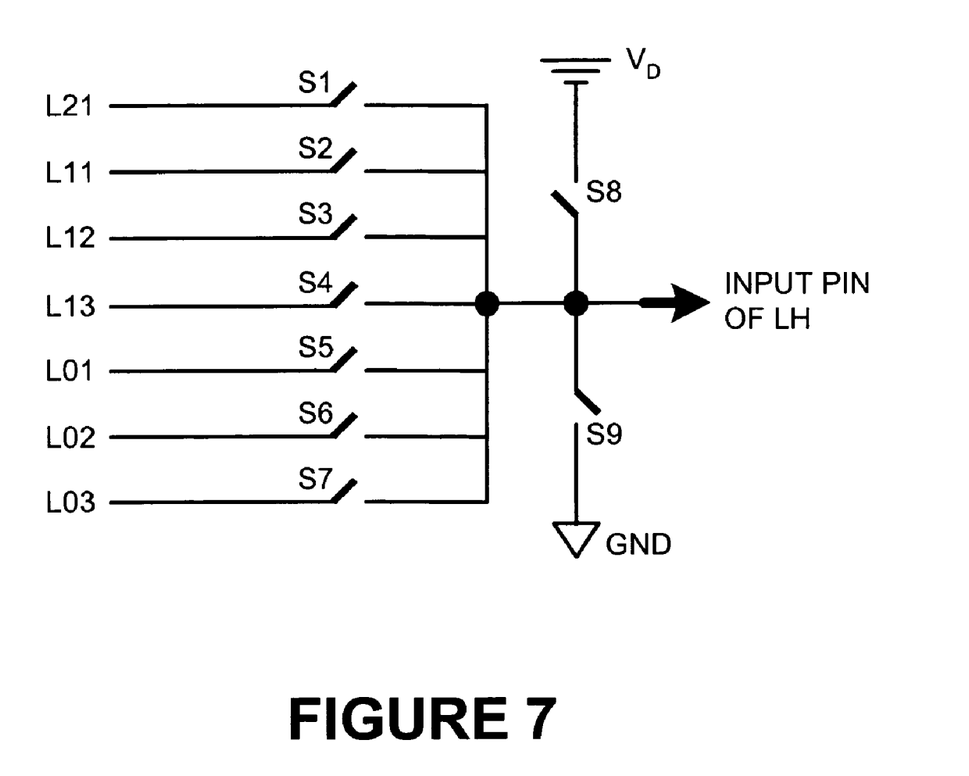
FIG. 7 shows a logic head input circuit used by the logic head cells of FIG. 3.

Turning to FIG. 7, the inputs to the logic heads acquire the input signal through programmable switches S1–S7. In this example of FIG. 7, an input to a logic head (one from the group of IP1–IP5/$C_{in}$ and $C_{in}$) originates from either one of its most adjacent neighboring logic heads or itself through one of three dedicated level zero lines (L01, L02 and L03) or from one of the level one lines (L11, L12, L13 . . . , L1n) or from one of level two lines (L21, . . . , L2m). For simplicity, FIG. 7 only shows three level one lines and one level two line. However, in other embodiments, fewer or greater lines for each level of interconnect is possible.

Pass switches S1–S7 are used to control to origination of an input to a logic head. To avoid signal contention or collision, only one switch S1–S9 is allowed to be programmed to the on position. When an input pin is unused, it is tied to either Vdd or Gnd using switches S8 or S9.

Figure 6:
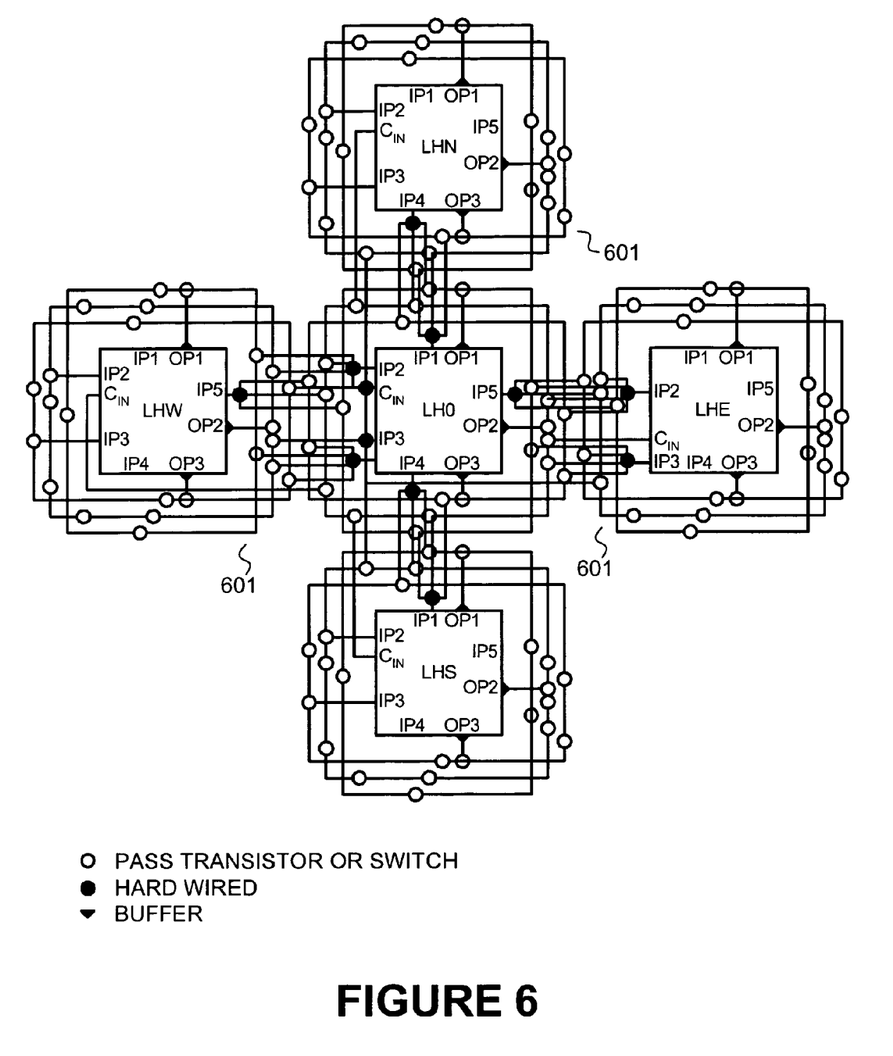
FIG. 6 shows an FPGA architecture with a level zero interconnect structure.

FIG. 6 illustrates a logic head 103 that can be selectively connected through programmable switches to four immediately adjacent logic heads by means of a level zero interconnect 601. The logic head designated LH0 is at the center. Through dedicated lines, the outputs of LH0 (OP1–OP3) and the inputs to LH0 (IP1–IP5/$C_{in}$ and $C_{in}$) can connect to its most adjacent neighbors to the east, to the north, to the south, and to the west, respectively. Those dedicated connections are implemented with three rings (one for each output signal OP1–OP3) surrounding each logic head. Each logic head's output has its own dedicated ring. Each ring is then connected to various inputs in the neighboring logic heads.

As noted above, FIG. 1 illustrates an array of logic heads 103 that can be selectively connected through programmable switches to other logic heads by means of a level one interconnect 105. The level one interconnect network is generally used when a connection is needed that is beyond the most immediate neighbors. In one embodiment, the level one interconnect network is generally used when switch time delay is between 3 and 5 units inclusive. A connection point and a conventional routing switch causes one switch time unit delay each. However, a crossover switch (seen in FIG. 2) generates two switch time unit delays.

Figure 8:
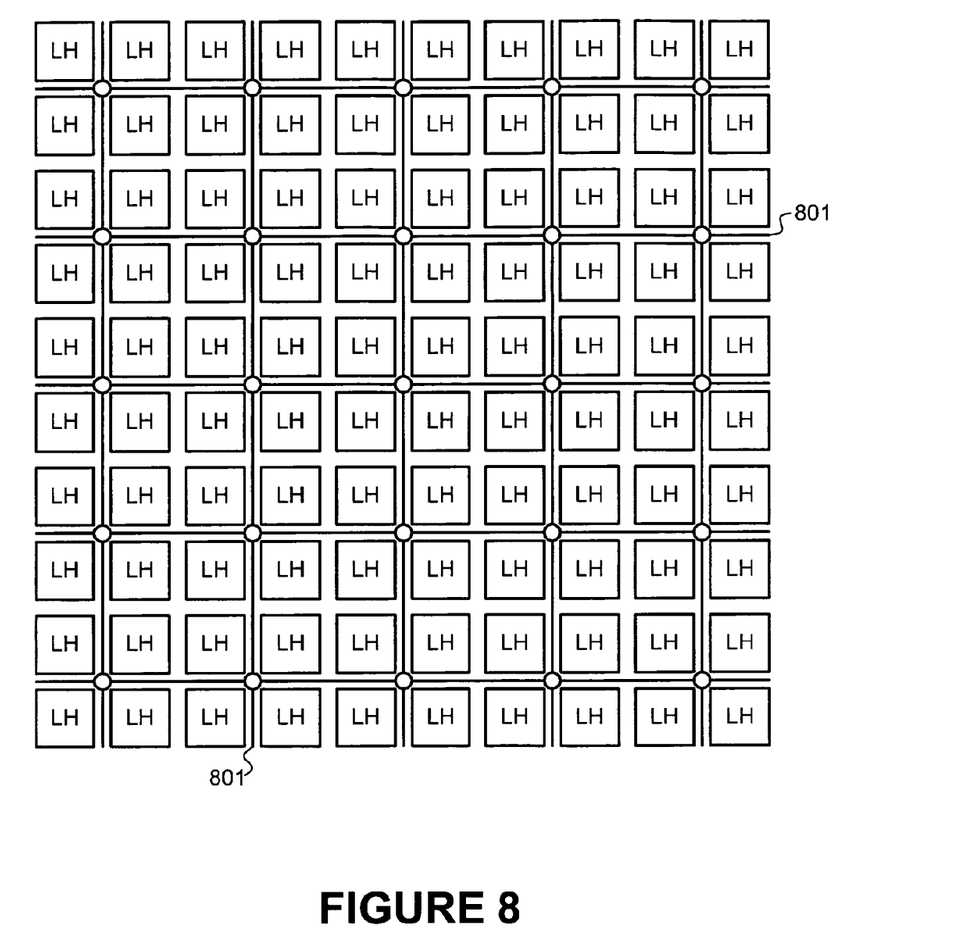
FIG. 8 shows an FPGA architecture with a level two interconnect structure.

FIG. 8 illustrates logic heads 103 that can be selectively connected through programmable switches to distant logic heads by means of a level two interconnect 801. In general, the level two interconnect 801 is for transmitting signals between logic heads that are relatively far apart. The level two interconnect 801 minimizes the amount of time delay, since switches are farther apart and fewer switches are traversed relative to the amount of distance traveled.

Figure 10:
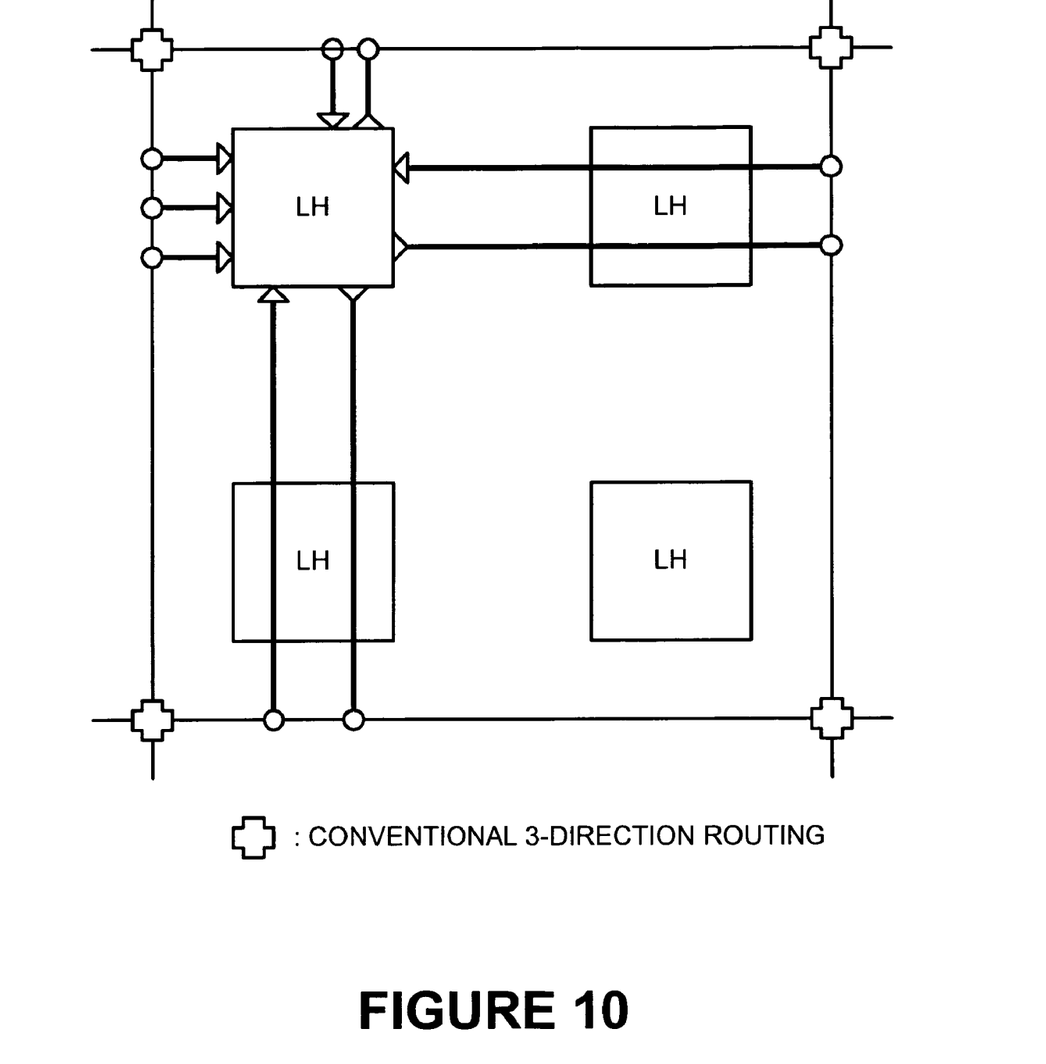
FIG. 10 is a schematic illustration of an FPGA architecture showing connections between a logic head and level two interconnect structure formed in accordance with the present invention.

FIG. 10 shows in greater detail the connections of a logic head to the level two interconnect 801. Note that the inputs to the logic head can come from all directions, and not just from one direction.

Figure 2:
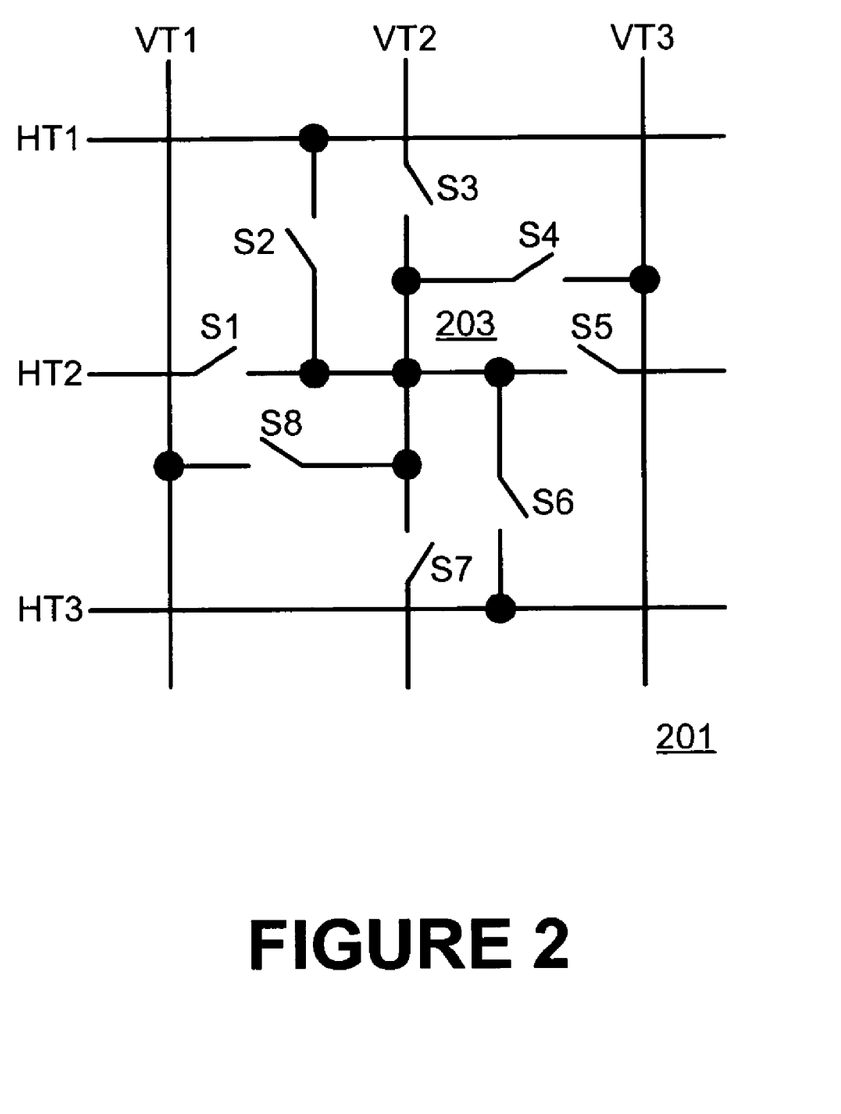
FIG. 2 is a schematic illustration of a crossover switch used in the interconnect structure of the FPGA of FIG. 1.

FIG. 2 illustrates a crossover switch 201 that can be used in the interconnect structures. For example the crossover switch of the present invention may be used in the level one interconnect of FIG. 1 and are shown by reference numerals 201. The crossover switch 201 consists of eight pass transistors S1–S8. In addition, the crossover switch is shown operating on three vertical lines VT1–VT3 intersecting with three horizontal lines HT1–HT3. The crossover switch can be adapted to work with a greater or lesser number of intersecting signal lines.

When a downward signal on VT2 needs to cross over to a parallel track, i.e., VT1 or VT3, switches S3 and S8 or S3 and S4 are programmed to be on. Alternatively, when it is desired. To route the signal to HT1 or HT3, switches S3 and S2 or S3 and S6 are programmed to be on. Further, when it is desired to route the signal onto HT2 going left, switches S3 and S1 are programmed to be on. Finally, when it is desired to route the signal onto HT2 right, switches S3 and S5 are programmed to be on. Thus, as can be seen, using the cross over switch of FIG. 2, any signal traveling on any line can be routed onto another line by selectively programming the switches S1–S8. Since a crossover switch 201 is physically symmetrical in all directions, no matter where an incoming signal originates, it can be switched to any other line. Every connection costs two switch time unit delays.

Examining the crossover switch of FIG. 2 in greater detail, it can be seen that each line VT1–VT3 and HT1–HT3 can be switched into and out of a central "island node" 203. For example, VT1 is connected to the island node 203 by switch S8, VT3 is connected to the island node through switch S4, HT1 is connected to the island node 203 by switch S2, HT3 is connected to the island node through switch S6, VT2 is connected to the island node 203 by switches S3 and S7, and HT2 is connected to the island node 203 by switches S1 and S5. The general concept is that each line should be able to access the island node 203. Thus, although three vertical and three horizontal lines are shown in FIG. 2, the crossover switch 201 can be modified to have more or less lines.

It should be noted that the programmable switches discussed above can be implemented as conventional transistor switches, or in the alternative, use switches and programmable nonvolatile memory formed in accordance with pending U.S. patent application Ser. No. 09/955,641 filed Sep. 18, 2001 entitled "SEMICONDUCTOR MEMORY CELL AND MEMORY ARRAY USING A BREAKDOWN PHENOMENA IN AN ULTRA-THIN DIELECTRIC", U.S. patent application Ser. No. 10/024,327 filed Dec. 17, 2001 entitled "SEMICONDUCTOR MEMORY CELL AND MEMORY ARRAY USING A BREAKDOWN PHENOMENA IN AN ULTRA-THIN DIELECTRIC", and U.S. patent application Ser. No. 10/133,704 filed Apr. 26, 2002 entitled "HIGH DENSITY SEMICONDUCTOR MEMORY CELL AND MEMORY ARRAY USING A SINGLE TRANSISTOR", assigned to the assignee of the present invention and which are herein incorporated by reference in their entirety.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A crossover switch adapted for use in an interconnect structure of a field programmable gate array (FPGA), said crossover switch for switching a propagating signal between any one of a first, a second, and a third vertical lines to any one of a first, a second, and a third intersecting horizontal lines, said crossover switch located at the intersection of said three intersecting horizontal lines and said three vertical lines, said crossover switch comprising:

an island node at a cross-section of the first vertical and the first horizontal lines, wherein the island node divides each of the first vertical and the first horizontal lines into a first and a second part, and wherein the island node is configured to receive a signal on one of said three vertical lines or one of said three horizontal lines and selectively route said signal to one of said three vertical lines or one of said three horizontal lines; and eight programmable switches that when programmed are configured to connect each of said three vertical lines and each of said three intersecting horizontal lines to said island node, wherein:

each one of four of the eight programmable switches connects the island node to one of the first and the second parts of the first vertical line and the first and the second parts of the first horizontal line; and each one of remaining four of the eight programmable switches connects the island node to one of the second and the third vertical and the second and the third horizontal lines.

2. A crossover switch adapted for routing a propagating signal from any one of V vertical lines to any one of H intersecting horizontal lines or vise versa, the crossover switch comprising:

an island node at a cross-section of one of the vertical lines (vertical-node-line) and one of the horizontal lines (horizontal-node-line), wherein the island node divides both the vertical-node-line and the horizontal-node-line into a first and a second part;

V+H+2 programmable switches that when programmed are configured to electrically connect each of the V vertical lines and each of the H horizontal lines to said island node, wherein:

four of the V+H+2 programmable switches connect the island node to the first and the second parts of the vertical-node-line and the first and the second parts of the horizontal-node-line; and each of remaining V+H−2 programmable switches connects the island node to one of remaining V−1 vertical and H−1 horizontal lines; and a configuration wherein the island node receives a signal from one of the V vertical or H horizontal lines and, using programmable switches, selectively routes the signal to any other vertical or horizontal lines.

3. The crossover switch of claim 2 wherein V=3 and H=3.

4. The crossover switch of claim 2 wherein programmable switches comprise transistors.

5. The crossover switch of claim 2 wherein each programmable switch is formed by an NMOS pass transistor and a nonvolatile memory cell.

* * * * *

UNITED STATES PATENT AND TRADEMARK OFFICE
CERTIFICATE OF CORRECTION

PATENT NO. : 6,977,521 B2
APPLICATION NO. : 11/109966
DATED : December 20, 2005
INVENTOR(S) : Man Wang It is certified that error appears in the above-identified patent and that said Letters Patent is hereby corrected as shown below:

<u>Column 6</u>
Line 18, "desired. To" should be --desired, to--;

Signed and Sealed this

Fifth Day of February, 2008

JON W. DUDAS
*Director of the United States Patent and Trademark Office*